United States Patent [19]

Mueller et al.

[11] 3,801,924

[45] Apr. 2, 1974

[54] DIFFERENTIAL AMPLIFIER

[75] Inventors: Hans Mueller; William C. Voigt, both of Houston, Tex.

[73] Assignee: Texas Instruments Incorporated, Dallas, Tex.

[22] Filed: Aug. 14, 1972

[21] Appl. No.: 280,316

Related U.S. Application Data

[63] Continuation of Ser. No. 68,276, Aug. 31, 1970, abandoned.

[52] U.S. Cl. .......................... 330/69, 330/85, 330/103

[51] Int. Cl. .......................... H03f 1/00

[58] Field of Search .......................... 330/103, 51, 85, 69; 340/347

[56] References Cited

UNITED STATES PATENTS

| | | | |
|---|---|---|---|
| 3,449,741 | 6/1969 | Egerton, Jr. | 340/347 |
| 3,412,343 | 11/1968 | Hansen | 330/103 |
| 3,516,002 | 6/1970 | Hillis | 330/51 |

*Primary Examiner*—Nathan Kaufman

[57] ABSTRACT

A differential amplifier used as a line receiver for time multiplexed analog signals is shown. The normal amplification operation of the amplifier is cut off at predetermined intervals and the amplifier is reset.

2 Claims, 4 Drawing Figures

INVENTORS
Hans Mueller
William C. Voigt

BY Jim Confort
ATTORNEY

DIFFERENTIAL AMPLIFIER

This is a continuation of application Ser. No. 068,276, filed Aug. 31, 1970, now abandoned.

This invention is directed to a differential amplifier and more particularly to a differential amplifier which is reset stabilized.

Differential amplifiers are used as line receivers for time multiplexed analog signals. In such time multiplexed analog signals, the signal level often ranges from around 10 microvolts to several volts. The differential amplifier used as a line receiver for such a signal must have low noise, fast settling time and a good common mode rejection ratio. Such a differential amplifier must also have a low dc drift since the following stages of amplification are dc coupled.

One approach to provide such a differential amplifier for a line receiver for a time multiplexed analog signal is to use a differential amplifier which is kept at a constant temperature by means of an oven. This approach consumes a significant amount of power and also takes a relatively long period of time for the temperature to stabilize, thus making it undesirable for use in field environments where it is difficult to control the temperature. Another approach has been to use a chopper stabilized differential amplifier, however a chopper stabilized differential amplifier does not meet certain stringent requirements such as low noise, fast settling time and a fast overload recovery.

It is therefore an object of this invention to provide a differential amplifier.

Another object of this invention is to provide a differential amplifier which can be used as a line receiver for a time multiplexed analog signal.

A further object of this invention is to provide a differential amplifier having low noise, fast settling time and a good common mode rejection ratio.

IN THE DRAWINGS

Figure 1:
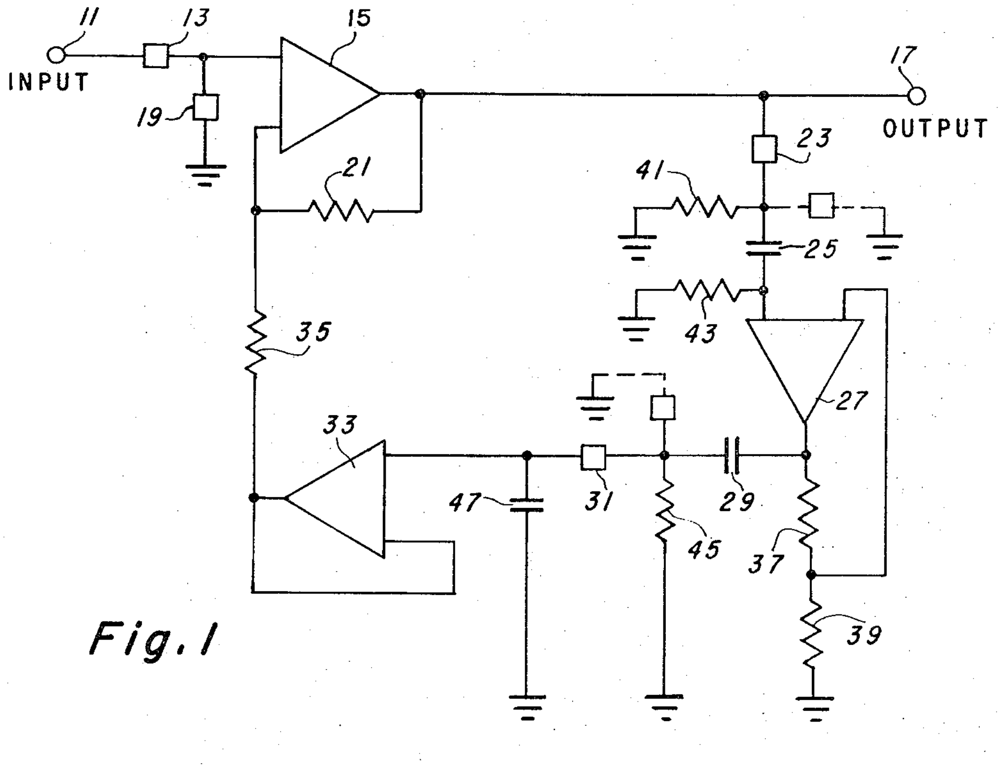
FIG. 1 is one embodiment of a differential amplifier constructed according to this invention.

Referring first to FIG. 1 for a description of the reset stabilized amplifier the input signal is applied to input terminal 11 through a switch 13 to the plus terminal of an amplifier 15. The output from amplifier 15 is the output from the reset stabilized circuit on output terminal 17. A switch 19 is connected between switch 13 and the plus input terminal of amplifier 15 to ground. A resistor 21 is connected across amplifier 15. The output from amplifier 15 is connected through a switch 23, capacitor 25 to the plus terminal of amplifier 27. The output of amplifier 27 is connected through capacitor 29, switch 31 to the plus input terminal of an amplifier 33. The output from amplifier 33 is connected through resistor 35 to the minus input terminal of amplifier 15. The minus input terminal of amplifier 27 is connected through a resistor 37 to its output terminal thereby producing a closed loop gain of 1,000. Resistor 37 is connected through resistor 39 to ground. Resistors 41 and 43 are connected on each side of capacitor 25 to ground. A resistor 45 is connected between capacitor 29 and switch 31 to ground. Capacitor 47 is connected between the plus input terminal of amplifier 33 and switch 31 to ground. The output terminal of amplifier 33 is also connected back to its minus input terminal.

Figure 2:
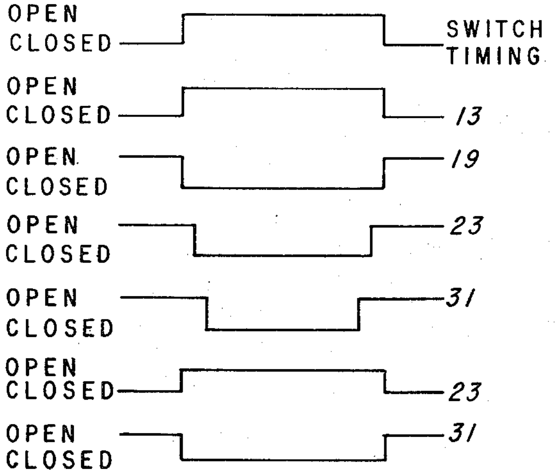
FIG. 2 shows the timing for the transistor switches used in FIG. 1.

The timing of the switches 13, 19, 23 and 31 is shown in FIG. 2. The low level of the switch timing means that the switch is closed and the high level means that the switch is open.

Amplifier 27 is an ac coupled amplifier and adds therefore no dc drift of the circuit. Amplifier 33 is a hold amplifier which feeds the dc signal to the inverting input of amplifier 15.

Switches 13, 19, 23 and 31 are transistor switches.

OPERATION

During normal operation of the amplifier, switch 13 is closed and switches 19, 23 and 31 are open. The gain of amplifier 15 is determined by the equation $$\text{gain} = (R21 + R35)/R35$$

At the beginning of the reset period, as shown in FIG. 2, switch 19 closes. Thus the normal operation of amplifier 15 ceases. After amplifier 15 has settled, switch 23 closes and after amplifier 27 has settled, switch 31 closes. If there is any offset at the output of amplifier 15, it is being transmitted to the input of amplifier 27 as a step function at the closure of switch 23. This step is amplified and charges the hold capacitor 47 through switch 31. Since the dc offset is transformed into a step function, amplifier 27 is an ac coupled amplifier and adds therefore no dc drift to the circuit. Amplifier 33 is a hold amplifier which feeds the dc signal to the inverting input of amplifier 15. This tends to cancel the initial offset present at the output of amplifier 15. After the reset periods, when switches 19, 23 and 31 are open and switch 13 is closed, normal operation of amplifier 15 proceeds. The compensating voltage however remains stored on capacitor 47 keeping the output offset of amplifier 15 compensated.

Resistors 41 and 45 could be replaced by transistor switches. This would increase the efficiency of the stabilization if the circuit were used at a high duty cycle. Amplifier 27 is shown in FIG. 1 having a gain of 1,000. Higher gains will increase the accuracy of the stabilization as long as the amplifier recovers sufficiently fast from the switching transient of switch 23.

Figure 3:
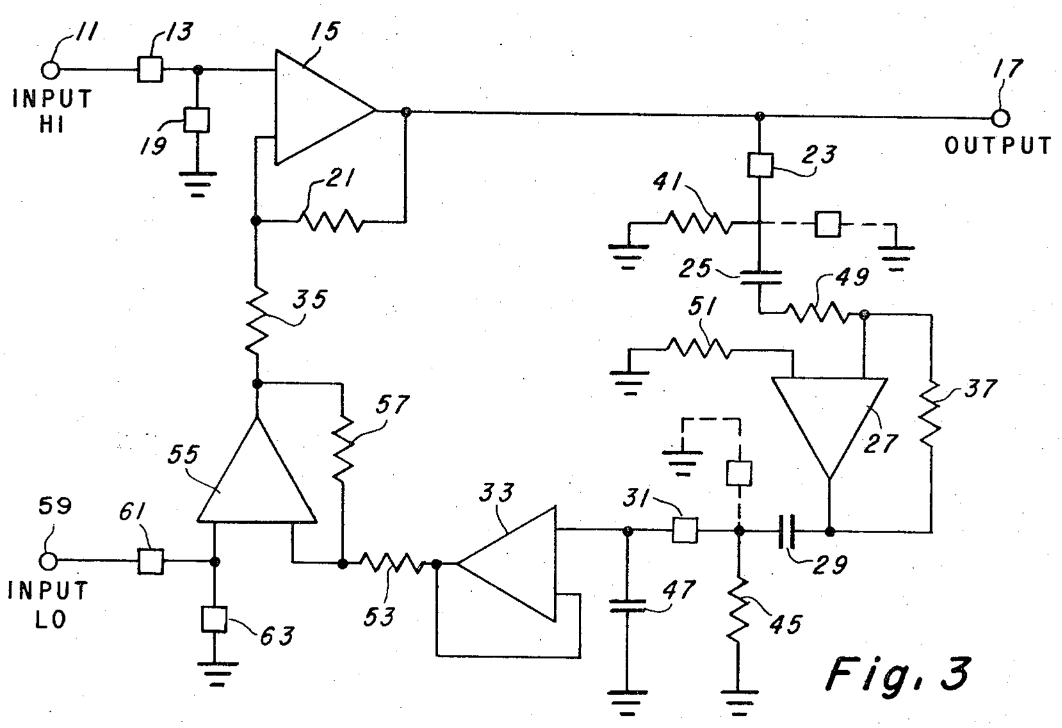
FIG. 3 is a second diagram of a second embodiment of this invention.

Referring now to FIG. 3 for a similar circuit the components shown in FIG. 3 which correspond to those shown in FIG. 1 are identified with the same number used in FIG. 1. In FIG. 3 capacitor 25 is connected through resistor 49 to the minus input terminal of amplifier 27 and a resistor 51 is connected to the plus input terminal of amplifier 27. The output terminal of amplifier 33 is connected through a resistor 53 to the minus input terminal of amplifier 55. A resistor 57 is connected across amplifier 55 from its minus input terminal to its output terminal. Input 11 is now connected to a high input and the second input terminal 59 is connected to the low input with the input terminal 59 connected through a switch 61 to the plus input terminal of amplifier 55. Another switch 63 connects the plus input terminal of amplifier 55 to ground. The gain of amplifier 15 is close to unity in FIG. 3. Amplifier 55 now introduces a 180° phase shift and amplifier 27 is connected as an inverting amplifier to retain the correct overall polarity. The plus input terminal of amplifier 55 is now the common mode or low input and has a pair of switches 61 and 63 which operate synchronously with switches 13 and 19 on the input terminal 11. The gain from the low input applied to terminal 59 to the output is a minus 10 over 9. Since the gain from the high input to the output is a plus 10 over 9, the circuit rejects common mode signals. The common mode rejection ratio can be adjusted by varying the gain of amplifier 55. Any gain of amplifier 15 may be used as long as the gain of amplifier 55 is also changed accordingly in order to obtain a high common mode rejection.

Figure 4:
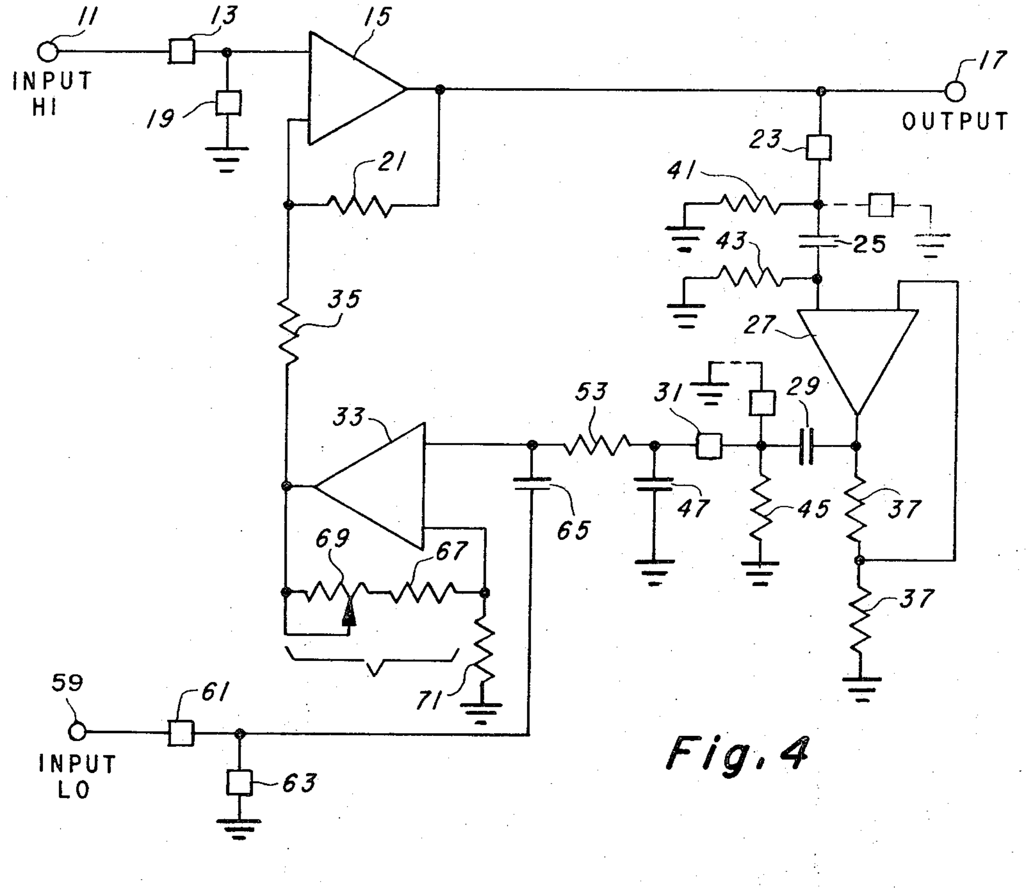
FIG. 4 is a third embodiment of this invention.

Refer now to FIG. 4 for a similar circuit with the same reference numerals used as in FIG. 1 and 3 when appropriate. The low input terminal 59 connected through transistor switch 61 is connected through capacitor 65 to the plus input terminal of amplifier 33. The fourth amplifier, designated as amplifier 55, in FIG. 3 is omitted in FIG. 4. Switch 63 connects through capacitor 65 the plus input terminal of amplifier 33 to ground.

A resistor 67 and an adjustable 69 resistor connect the minus input terminal of amplifier 33 to its output terminal. Resistor 71 connects the minus input terminal of amplifier 33 to ground.

The reset stabilized amplifier of FIG. 4 with the fourth amplifier omitted has the same time multiplexed input signal as the other amplifiers. Since the time multiplexed input signal does not require dc coupling, the common mode signal is fed to amplifier 33 through the hold capacitor 65. This eliminates one amplifier with its associated noise. The gain of amplifier 33 is adjustable to maximize the common mode rejection. Capacitor 47 in FIG. 4 is a roll-off capacitor which is needed for stability because the on resistance of switch 63 is in series with capacitor 65 which introduces at break point of about 24 hertz.

The amplifier shown in FIG. 4 shows a dc drift of less than $$0.2\ \mu V/C^\circ$$

referred to the output over a 0 to a 55° centrigrade temperature range. This was measured with a stabilization interval of 32 microseconds and a repeat rate of 125 hertz. The noise measured at the output over noise band width of 350 KHZ was less than $$\mu\ Vrms$$

with amplifiers 15 and 33 being discrete amplifiers.

The reset stabilized amplifiers shown in FIGS. 1, 2–4 can be used whenever time multiplexed data is handled and one channel interval can be used as a reset stabilization period.

What is claimed is:

1. A differential amplifier for amplifying an analog input signal comprising:

a. means for receiving said analog input signal, b. amplifying means normally connected to said receiving means for amplifying said analog input signal, c. means for disconnecting said amplifying means from receiving means at predetermined periods of time, d. a high gain ac coupled amplifier, means for connecting said high gain ac coupled amplifier to the output of said amplifying means a predetermined period of time after said amplifying means has been disconnected from receiving means for sensing the D.C. offset voltage from the output of said amplifying means, and e. a hold amplifier having a capacitor on its input connected to the output of said high gain ac coupled amplifier for applying a compensating signal to the inverting input of said amplifying means to cancel the offset voltage from said amplifying means.

2. The invention claimed in claim 1 including a common mode rejection amplifier connected between said hold amplifier and said amplifier to provide common mode rejection.

* * * * *